(12) United States Patent
Lin et al.

(10) Patent No.: US 12,101,903 B2
(45) Date of Patent: Sep. 24, 2024

(54) DISPLAY PANEL AND MOBILE TERMINAL

(71) Applicant: WUHAN CHINA STAR OPTOELECTRONICS SEMICONDUCTOR DISPLAY TECHNOLOGY CO., LTD., Hubei (CN)

(72) Inventors: Feiming Lin, Hubei (CN); Chen Zhao, Hubei (CN); Kuihua You, Hubei (CN); Xiaowen Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/755,529

(22) PCT Filed: Mar. 14, 2022

(86) PCT No.: PCT/CN2022/080550
§ 371 (c)(1),
(2) Date: Apr. 29, 2022

(87) PCT Pub. No.: WO2023/151148
PCT Pub. Date: Aug. 17, 2023

(65) Prior Publication Data
US 2024/0172380 A1    May 23, 2024

(30) Foreign Application Priority Data
Feb. 11, 2022  (CN) .......................... 202210128390.5

(51) Int. Cl.
H05K 5/03       (2006.01)

(52) U.S. Cl.
CPC ..................................... *H05K 5/03* (2013.01)

(58) Field of Classification Search
CPC ........................................................ H05K 5/00
See application file for complete search history.

(56) References Cited

U.S. PATENT DOCUMENTS

| 2018/0083210 A1 | 3/2018 | Choi |
| 2018/0197933 A1 | 7/2018 | Son |

(Continued)

FOREIGN PATENT DOCUMENTS

| CN | 108281387 A | 7/2018 |
| CN | 109119453 A | 1/2019 |

(Continued)

OTHER PUBLICATIONS

International Search Report in International application No. PCT/CN2022/080550, mailed on Oct. 27, 2022.

(Continued)

*Primary Examiner* — Jerry Wu
(74) *Attorney, Agent, or Firm* — PV IP PC; Wei Te Chung

(57) ABSTRACT

The present invention provides a display panel and a mobile terminal, including a panel layer including, but not limited to, a first portion, a second portion, and a curved third portion connected therebetween; a protective layer on the third portion; a first support layer on a side of the panel layer away from the protective layer and disposed opposite to the first portion; and a cover layer on the first portion and including an edge as an ink layer; the protective layer has a minimum thickness on a side close to the first portion and between a boundary of the first portion and an inner boundary of the ink layer.

14 Claims, 4 Drawing Sheets

(56) References Cited

U.S. PATENT DOCUMENTS

| | | |
|---|---|---|
| 2019/0250441 A1 | 8/2019 | Hiramoto et al. |
| 2020/0022261 A1 | 1/2020 | Choi |
| 2020/0295283 A1 | 9/2020 | Lee |
| 2021/0050534 A1* | 2/2021 | Yang ............... H10K 71/00 |
| 2021/0126209 A1 | 4/2021 | Lee |
| 2021/0201711 A1 | 7/2021 | Yun |

FOREIGN PATENT DOCUMENTS

| | | |
|---|---|---|
| CN | 109388278 A | 2/2019 |
| CN | 109859642 A | 6/2019 |
| CN | 111048681 A | 4/2020 |
| CN | 111785760 A | 10/2020 |
| CN | 111951676 A | 11/2020 |
| CN | 112002257 A | 11/2020 |
| CN | 112198981 A | 1/2021 |
| CN | 113053244 A | 6/2021 |
| CN | 113140158 A | 7/2021 |
| CN | 113192420 A | 7/2021 |
| CN | 113314033 A | 8/2021 |
| CN | 113470522 A | 10/2021 |
| CN | 113690385 A | 11/2021 |
| CN | 113888980 A | 1/2022 |
| CN | 113924331 A | 1/2022 |
| KR | 20200041408 A | 4/2020 |
| KR | 20210083970 A | 7/2021 |

OTHER PUBLICATIONS

Written Opinion of the International Search Authority in International application No. PCT/CN2022/080550, mailed on Oct. 27, 2022.

Chinese Office Action issued in corresponding Chinese Patent Application No. 202210128390.5 dated Sep. 19, 2022, pp. 1-9.

Chinese Office Action issued in corresponding Chinese Patent Application No. 202210128390.5 dated Feb. 11, 2023, pp. 1-7.

Chinese Decision of Rejection issued in corresponding Chinese Patent Application No. 202210128390.5 dated Sep. 11, 2023, pp. 1-7.

Korean Office Action issued in corresponding Korean Patent Application No. 10-2022-7013195 dated Sep. 26, 2023, pp. 1-8.

Japanese Office Action issued in corresponding Japanese Patent Application No. 特願2022-541974 dated Apr. 16, 2024, pp. 1-5.

\* cited by examiner

DISPLAY PANEL AND MOBILE TERMINAL

TECHNICAL FIELD

The present invention relates to a field of display technology, in particular to a field of display panel manufacturing, in particular to a display panel and a mobile terminal.

BACKGROUND

A flexible display panel has large-scale applications in a display terminal such as a mobile phone, a tablet computer, and the like, because it is light and thin, bendable, and beautiful.

At present, in the flexible display panel manufactured by a technology of removal of a polarizer, since the polarizer is not provided to pad a protective film, a glue layer disposed at an edge of the protective film contacts a side of the protective film in a large area. Especially after a shape cutting, a butt fusion effect of the protective film and the glue layer is aggravated, and thus, the glue layer and even film layers at a bottom of the glue layer are driven to tear when the protective film is removed later, resulting in damage or even scrapping of the flexible display panel, and reducing yield of the flexible display panel in mass production.

Therefore, a prior flexible display panel has a low yield in mass production due to the above-mentioned problems and needs to be improved.

Technical Problems

The present invention provides a display panel and a mobile terminal to solve a technical problem in prior art where a glue layer disposed at an edge of a protective film contacts a side of the protective film in a large area, resulting in tearing the glue layer and even film layers at a bottom of the glue layer when the protective film is removed later.

SUMMARY

An embodiment of the present invention provides a display panel comprising:
- a panel layer comprising a first portion, a second portion, and a third portion connected to the first portion and the second portion, wherein the third portion is curved;
- a protective layer on the third portion;
- a support layer on a side of the panel layer away from the protective layer, wherein the support layer comprises a first support portion disposed opposite to the first portion;
- a cover layer on the first portion, wherein the cover layer comprises an ink layer formed as an edge of the cover layer;
- wherein a thickness of a side of the protective layer close to the first portion is less than a thickness of a middle portion of the protective layer, and the side of the protective layer close to the first portion is between a side of the first portion close to the third portion and an inner boundary of the ink layer;
- wherein the thickness of the side of the protective layer close to the first portion is less than or equal to 60 μm;
- wherein a thickness of an edge of the protective layer is less than the thickness of the middle portion of the protective layer.

In one embodiment, the protective layer extends from the third portion to the first portion, and a distance between the side of the protective layer close to the first portion and a side of the third portion close to the first portion is equal to or greater than 0.45 mm.

In one embodiment, the distance between the side of the protective layer close to the first portion and the side of the third portion close to the first portion is equal to or less than 0.6 mm.

In one embodiment, the protective layer extends from the third portion to the second portion, and a distance between a side of the protective layer away from the first portion and a side of the third portion away from the first portion is equal to or greater than 0.45 mm.

In one embodiment, a thickness of each portion of the protective layers is equal to or greater than 30 μm, and is equal to or less than 100 μm.

In an embodiment, the display panel further includes:
- an adhesive layer between the cover layer and the first portion, wherein the adhesive layer is configured to secure the cover layer to the first portion, a gap is defined between the adhesive layer and the protective layer, and a thickness of the adhesive layer is greater than the thickness of the side of the protective layer close to the first portion.

In one embodiment, the support layer further comprises a second support portion disposed opposite to the second portion.

An embodiment of the present invention further provides a display panel comprising:
- a panel layer comprising a first portion, a second portion, and a third portion connected to the first portion and the second portion, wherein the third portion is curved;
- a protective layer on the third portion;
- a support layer on a side of the panel layer away from the protective layer, wherein the support layer comprises a first support portion disposed opposite to the first portion;
- a cover layer on the first portion, wherein the cover layer comprises an ink layer formed as an edge of the cover layer;
- wherein a thickness of a side of the protective layer close to the first portion is less than a thickness of a middle portion of the protective layer, and the side of the protective layer close to the first portion is between a side of the first portion close to the third portion and an inner boundary of the ink layer.

In one embodiment, the thickness of the side of the protective layer close to the first portion is less than or equal to 60 μm.

In one embodiment, a thickness of an edge of the protective layer is less than the thickness of the middle portion of the protective layer.

In one embodiment, the protective layer extends from the third portion to the first portion, and a distance between the side of the protective layer close to the first portion and a side of the third portion close to the first portion is equal to or greater than 0.45 mm.

In one embodiment, the distance between the side of the protective layer close to the first portion and the side of the third portion close to the first portion is equal to or less than 0.6 mm.

In one embodiment, the protective layer extends from the third portion to the second portion, and a distance between a side of the protective layer away from the first portion and a side of the third portion away from the first portion is equal to or greater than 0.45 mm.

In one embodiment, a thickness of each portion of the protective layers is equal to or greater than 30 μm, and is equal to or less than 100 μm.

In an embodiment, the display panel further includes:
an adhesive layer between the cover layer and the first portion, wherein the adhesive layer is configured to secure the cover layer to the first portion, a gap is defined between the adhesive layer and the protective layer, and a thickness of the adhesive layer is greater than the thickness of the side of the protective layer close to the first portion.

In one embodiment, the support layer further includes a second support portion disposed opposite the second portion.

An embodiment of the present invention further provides a mobile terminal including a terminal body portion and a display panel as described above, wherein the terminal body portion and the display panel are integrated.

Beneficial Effects

The present invention provides a display panel and a mobile terminal, wherein the display panel and the mobile terminal include a panel layer including a first portion, a second portion, and a third portion connected to the first portion and the second portion, wherein the third portion is curved; a protective layer on the third portion; a support layer on a side of the panel layer away from the protective layer, wherein the support layer includes a first support portion disposed opposite to the first portion; a cover layer on the first portion, wherein the cover layer includes an ink layer formed as an edge of the cover layer; wherein a thickness of a side of the protective layer close to the first portion is less than a thickness of a middle portion of the protective layer, and the side of the protective layer close to the first portion is between a side of the first portion close to the third portion and an inner boundary of the ink layer. According to a principle of capillary action, the thickness of the side of the protective layer close to the first portion in the present invention is less than the thickness of the middle portion of the protective layer, so that in the process of manufacturing the protective layer, it is ensured a preset distance reserved between the constituent material of the protective layer and the removable film layer to achieve a side of a finally formed protective layer close to the first portion not contact excessively or even not contact the removable film layer, thereby reducing a risk can be ensured, so that the side close to the first portion of the protective layer can be finally formed without excessive contact or even contact with the removable film layer, thereby reducing a risk of tearing the protective layer when removing the removable film, and increasing the yield of the display panel in mass production.

BRIEF DESCRIPTION OF THE DRAWINGS

The application will be further described with reference to the accompanying drawings. It should be noted that the accompanying drawings in the following description are merely intended to explain some embodiments of the present application, and other drawings may be obtained from these drawings without creative effort by those skilled in the art.

DETAILED DESCRIPTION OF THE EMBODIMENTS

The technical solutions of the embodiments of the present invention will be described with clarity and completeness below in conjunction with the accompanying drawings of the embodiments of the present invention. It will be apparent that the described embodiments are only some but not all of the embodiments of the invention. Based on the embodiments of the invention, all other embodiments obtained by those skilled in the art without creative effort are within the scope of the invention.

The terms "first" and "second" are used to distinguish different subjects, and not used to describe specified orders. Moreover, the terms "comprise" and "have" and any variations thereof are intended to cover non-exclusive inclusions. For example, a process, method, system, product, or device that includes a series of steps or modules is not limited to the listed steps or modules, but optionally further includes the steps or modules that are not listed, or optionally further includes other steps or modules inherent to these processes, methods, products, or devices.

Reference herein to "embodiments" means that specific features, structures, or characteristics described in connection with embodiments may be included in at least one embodiment of the present invention. The occurrence of this phrase at various parts in the specification does not necessarily mean the same embodiment, nor is it an independent or alternative embodiment mutually exclusive with other embodiments. Those skilled in the art will explicitly and implicitly understand that the embodiments described herein may be combined with other embodiments. In addition, it should be noted that the drawings provide only a structure which is closely related to the present invention, and some details which have little relations to the present invention are omitted. The purpose of the drawings is to simplify and make the points of the invention clear at a glance, rather than to indicate that the actual device is the same as the drawings and is not a limitation of the actual device.

The present invention provides a display panel including, but not limited to, the following embodiments and combinations of the following embodiments.

Figure 1:
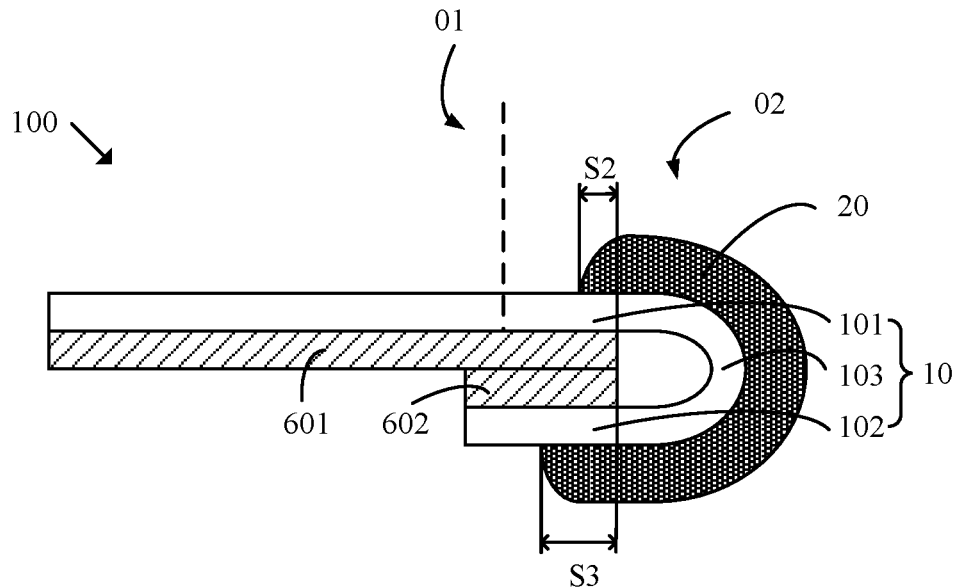
FIG. 1 is a cross-sectional schematic diagram of a first display panel according to an embodiment of the present invention.
Figure 2:
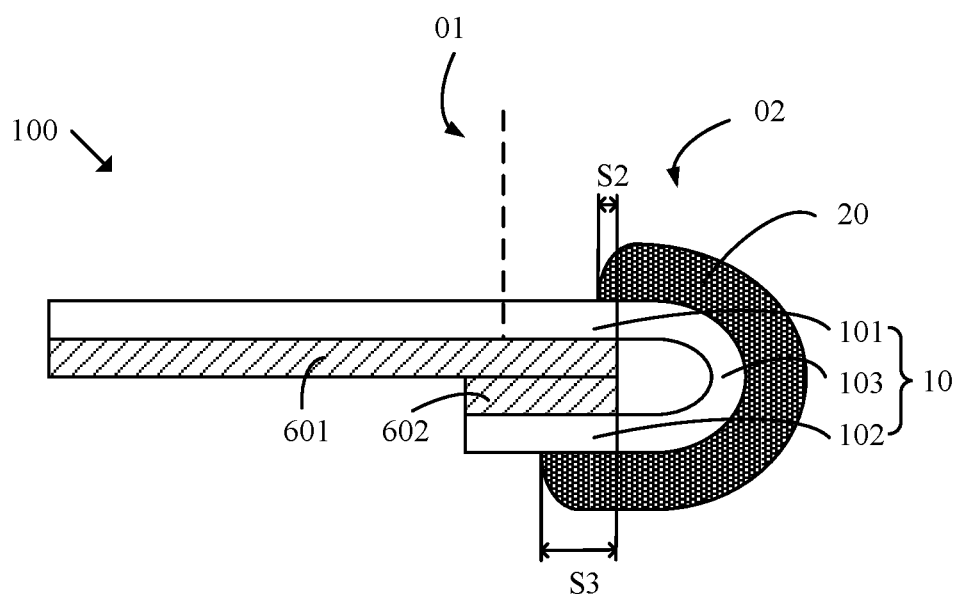
FIG. 2 is a cross-sectional schematic diagram of a second display panel according to an embodiment of the present invention.

In an embodiment, as shown in FIGS. 1 and 2, the display panel 100 includes a panel layer 10, a protective layer 20, a support layer, and a cover layer. The panel layer includes a first portion 101, a second portion 102, and a third portion 103 connected to the first portion 101 and the second portion 102, wherein the third portion 103 is curved. The protective layer 20 is disposed on the third portion 103. The support layer is disposed on a side of the panel layer away from the protective layer, and the support layer includes a first support portion 601 disposed opposite the first portion 101. The cover layer is disposed on the first portion 101, and includes an ink layer as an edge of the cover layer. Wherein a thickness of a side of the protective layer 20 close to the first portion 101 is less than a thickness of a middle portion of the protective layer 20. A side of the protective layer 20 close to the first portion 101 is between a side of the first portion 101 close to the third portion 103 and an inner boundary of the ink layer.

Specifically, a section of the third portion 103 may be semicircular or U-shaped, wherein an end of the semicircular or U-shaped may be connected to the first portion 101, and another end of the semicircular or U-shaped may be connected to the second portion 102, that is, the first portion 101 and the second portion 102 may be disposed close to an opening of the third portion 103, and the second portion 102 may be disposed opposite to the first portion 101 by the third portion 103 which is semicircular or U-shaped. Further, a rigidity of the third portion 103 may be less than a rigidity of the first portion 101 and a rigidity of the second portion 102 to achieve a curved shape. Wherein the first portion 101 may be provided with a display area 01, and the display area 01 may be constituted by a closed area defined by the inner boundary of the ink layer, that is, screen display may be performed within the closed area defined by the inner boundary of the ink layer.

Specifically, the display panel 100 in this embodiment may be formed by a technology of removal of a polarizer. The panel layer 10 may include a substrate layer, a circuit layer on the substrate layer, a light-emitting layer on the circuit layer, an encapsulation layer on the light-emitting layer, a touch layer on the encapsulation layer, a color film layer on the touch layer, and a planarization layer on the color film layer. Wherein a material of the substrate layer may include polyimide, and the circuit layer may include a plurality of thin film transistors arranged in an array and a plurality of lines connected to the plurality of thin film transistors. The plurality of lines may extend from the first portion 101 to the second portion 102 via the third portion 103 and then the second portion 102 is to be loaded with an electrical signal. In particular, the color film layer may include a plurality of light filtering portions corresponding one-to-one to a plurality of light-emitting portions in the light-emitting layer and light shielding portions positioned between two adjacent light filtering portions, wherein a light emitted by each light-emitting portion may pass through a corresponding light filtering portion to exhibit a corresponding color light. Further, the substrate layer may be formed as the first portion 101, the third portion 103, and the second portion 102; and the light-emitting layer, the encapsulation layer, and the touch layer may be in the display area 01 in the first portion 101 to achieve a screen display function and a touch function. The light-emitting layer, the encapsulation layer, and the touch layer should avoid extending to form the second portion 102 to avoid detachment or separating following a bending of the second portion 102. Of course, the touch layer may also be on a side of the encapsulation layer close to the light-emitting layer. Wherein a portion of the first portion 101 close to the third portion 103, the third portion 103, and the second portion 102 are formed as a non-display area 02.

Figure 3:
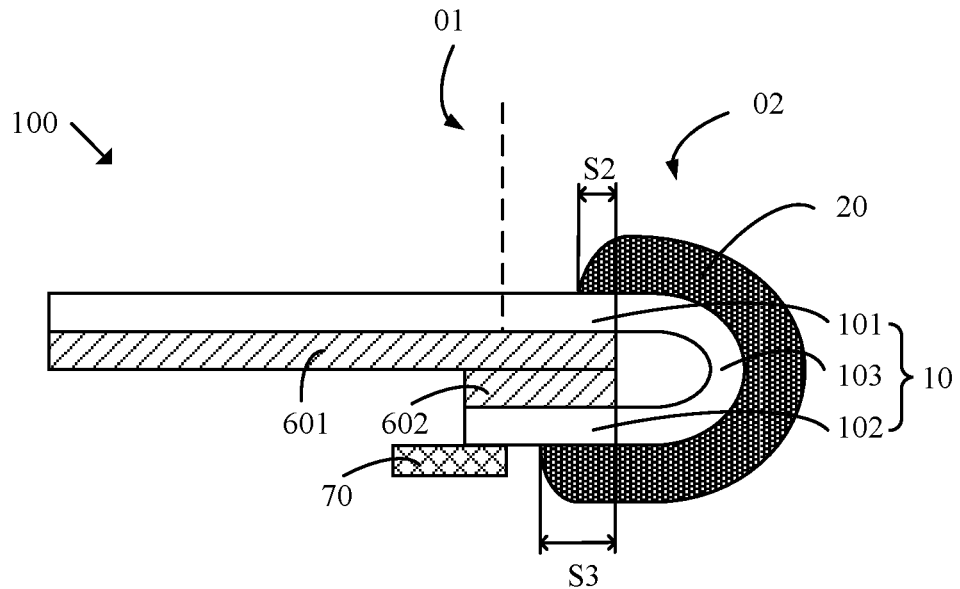
FIG. 3 is a cross-sectional schematic diagram of a third display panel according to an embodiment of the present invention.

Further, as shown in FIG. 3, the display panel 100 further includes a flexible circuit board 70 electrically connected to a side of the second portion 102 away from the third portion 103. Specifically, the flexible circuit board 70 may include a plurality of terminal portions, and the second portion 102 may include a plurality of pin portions corresponding one-to-one to the plurality of terminal portions. Each pin portion is electrically connected to a corresponding terminal portion. Wherein, the plurality of pin portions may be electrically connected to the plurality of terminal portions by press-fitting, and projections of the plurality of terminal portions on the second portion 102 may overlap the plurality of pin portions. Even further, the second portion 102 may further include a drive circuit on a side of the plurality of pin portions away from the plurality of terminal portions, and the drive circuit is electrically connected to the plurality of pin portions. Specifically, a first electrical signal may be electrically connected to a plurality of pin portions in the second portion 102 through a plurality of terminal portions in the flexible circuit board 70 to be loaded into the drive circuit, and a corresponding second electrical signal is generated via the drive circuit and then transmitted to a plurality of thin film transistors or other devices through a plurality of lines to control the light-emitting layer to emit light for screen display.

Figure 4:
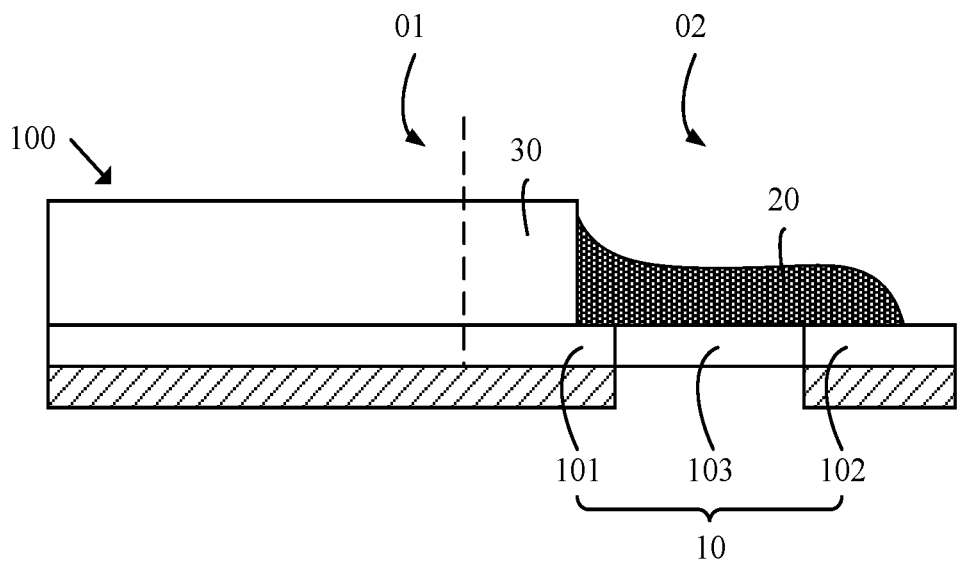
FIG. 4 is a schematic diagram of a manufacturing scene of a conventional display panel.
Figure 7:
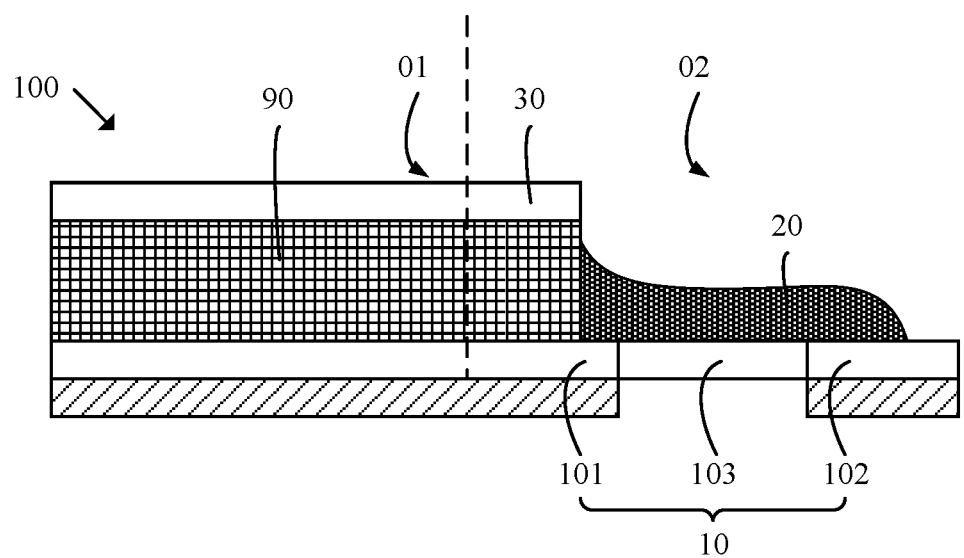
FIG. 7 is a cross-sectional schematic diagram of a display panel manufactured by a polarizer technology.

Comparing FIG. 7 and FIG. 4, FIG. 7 is a display panel manufactured by a polarizer technology, and FIG. 4 is a display panel manufactured by a technology of removal of a polarizer. It should be noted that, as shown in FIG. 7, in the display panel manufactured by the polarizer technology, a thickness of the polarizer 90 may be 150 µm, and a thickness of the protective layer may be 60 µm to 100 µm. Therefore, an upper surface of the protective layer 20 may be lower than an upper surface of the polarizer 90, this is, the protective layer 20 contacts with the polarizer during forming. Due to a presence of the polarizer 90, a possibility of the protective layer 20 contacting with a removable film 30 on the protective layer 20 is low. Even if the protective layer 20 is in contact with the removable film layer 30, a thickness of the protective layer 20 contacting with the removable film layer 30 is less than 20 µm, and removing the removable film layer 30 later results in no abnormality.

It should be noted that, as shown in FIG. 4, in the display panel manufactured by a technology of removal of the polarizer, in a process of manufacturing the display panel 100, the removable film layer 30 is formed on the first portion 101 by but not limited to attaching prior to forming the protective layer 20, and the removable film layer 30 is removed after the protective layer 20 and the binding or the like are performed to form a cover layer on the panel layer 10, wherein the removable film layer 30 can protect film layers in the first portion 101 from scratches during a process of binding or the like. However, according to a definition of capillary action, due to an attractive force of a liquid surface to a solid surface, capillary insertion into a wetting liquid causes a liquid level in a tube to rise above a liquid level outside the tube, and capillary insertion into a non-wetting liquid causes the liquid in the tube to fall below the liquid level outside the tube. In combination with the above discussion, a constituent material of the protective layer 20 is a wetting liquid for the removable film layer 30 on the first portion 101. Therefore, if a distance between the constituent material of the protective layer 20 and the removable film layer 30 is too small during a manufacturing of the protective layer 20, a larger area of the protective layer 20 is attached to a side of the removable film layer 30 close to the protective layer 20 due to capillary action. Thus, a thickness of the protective layer 20 close to the display area 01 is maximum, and a thickness of the protective layer 20 away from the display area 01 is minimum. When removing the removable film layer 30 later, the protective layer 20 may be torn and lose a function of protecting, thereby damaging the panel layer 10.

Figure 5:
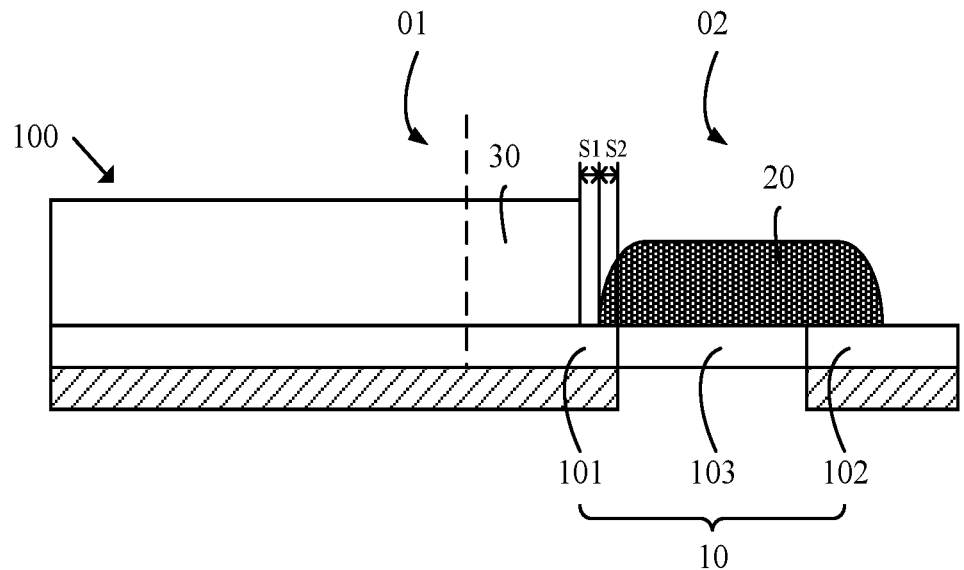
FIG. 5 is a cross-sectional schematic diagram of a fourth display panel according to an embodiment of the present invention.

It can be understood that, as shown in FIGS. 1 and 2, with reference to a shape of the protective layer 20 formed in the present embodiment and the discussion above, since the thickness of the side of the protective layer 20 close to the display area 01 is less than the thickness of the middle portion of the protective layer 20, it can be considered that no capillary action occurs between the protective layer 20 and the removable film layer 30 during the manufacturing of the display panel 100, so that the protective layer 20 does not come into contact with the removable film layer 30. Therefore, when the removable film layer 30 is later removed, a risk that the panel layer 10 is scratched due to losing a protective effect of the protective layer 20 by pulling the protective layer 20 is reduced, and a yield of the display panel 100 in mass production is increased. Specifically, in an aspect, in a process of forming the protective layer 20, a distance between a constituent material of the protective layer 20 and the removable film layer 30 can be reasonably set, as shown in FIG. 5, so that there is a preset distance 51 between a finally formed protective layer 20 and the removable film layer 30, thereby avoiding a capillary phenomenon as shown in FIG. 4. On another aspect, the side of the protective layer 20 close to the first portion 101 is located between a side of the first portion 101 close to the third portion 103 and the inner boundary of the ink layer, that is, the protective layer 20 may also cover a portion of the first portion 101 close to the third portion 103, so that the protective layer 20 may cover the drive circuit included in the second portion 102, at a same time, also cover the lines included in second portion 102, the first portion 101, and be electrically connected to the thin film transistor or other device in the display area 01, so as to protect the drive circuit and the lines, and reduce a risk where display abnormalities are caused by the protective layer 20 contacting with the film layer in the display area 01. An extent of protruding of the protective layer 20 at the middle is not limited in this embodiment.

As shown in FIG. 5, the preset distance 51 may be understood to be a distance between a side of the constituent material of the protective layer 20 close to the display area 01 and the side of the removable film layer 30 away from the display area 01 after a last addition of the constituent material of the protective layer 20. According to the above analysis, the preset distance 51 may be determined based on at least the constituent material and amount of the protective layer 20, the constituent material of the removable film layer 30, and the constituent material of the panel layer 10 to ensure that the thickness of the side of the protective layer 20 close to the display area 01 is finally less than the thickness of the middle portion of the protective layer 20. For example, the preset distance 51 may be 0.1 mm.

In an embodiment, as shown in FIGS. 1 and 2, the thickness of the side of the protective layer 20 close to the first portion 101 is less than or equal to 60 μm, that is, the thickness of the side of the protective layer 20 close to the display area 01 is less than or equal to 60 μm. Referring to the above analyses and FIG. 5, on a basis of "the thickness of the side of the protective layer 20 close to the display area 01 is less than the thickness of the middle portion of the protective layer", and further depending on the thickness of the removable film layer 30, the thickness of the side of the protective layer 20 close to the display area 01 is defined to be less than or equal to 60 μm. It can be understood that the thickness of the removable film layer 30 may be 90 μm to 150 μm, that is, the thickness of the side of the protective layer 20 close to the display area 01 in the present embodiment may be substantially less than ⅖ to ⅔ of the thickness of the removable film layer 30, that is, the thickness of the side of the protective layer 20 close to the display area 01 in the present embodiment may be much less than the thickness of the removable film layer 30, so that an area of the protective layer 20 in contact with the removable film layer 30 may be sufficiently small or even zero, thereby reducing the risk of causing the protective layer 20 to tear and lose the protective effect and even damaging the panel layer 10 when the removable film layer 30 is later removed, and improving the yield of the display panel 100 in mass production.

In an embodiment, as shown in FIGS. 1 and 2, the thickness of the protective layer 20 at an edge is less than the thickness of the middle portion of the protective layer 20. Specifically, as shown in FIG. 5, in the process of manufacturing the display panel 100, since the preset distance 51 is reserved between the constituent material of the protective layer 20 and the removable film layer 30, the side of the protective layer 20 close to the display area 01 is finally formed not contacting excessively or even not contacting the removable film layer 30 at all, thereby avoiding the capillary phenomenon shown in FIG. 4. Since a distance between a side of the second portion 102 away from the display area 01 and a side of the protective layer 20 away from the display area 01 can also be set farther, similarly, the capillary phenomenon does not occur on a side of the protective layer 20 finally formed away from the display area 01, and finally, the thickness of the protective layer 20 at the edge is less than the thickness of the middle portion of the protective layer 20. Wherein the extent of protruding of the protective layer 20 at the middle relative to protruding of the protective layer 20 at the edge is not limited. For example, the protective layer 20 may protrude at the middle to exhibit a convex surface and a highest point, or the protective layer 20 may exhibit a plane at the middle.

In an embodiment, as shown in FIGS. 1 and 2, the protective layer 20 extends from the third portion 103 to the first portion 101. A distance between the side of the protective layer 20 close to the first portion 101 and the side of the third portion 103 close to the first portion 101 is equal to or greater than 0.45 mm, that is, a distance between the side of the protective layer 20 close to the display area 01 and the side of the third portion 103 close to the display area 01 is equal to or greater than 0.45 mm. Specifically, as discussed above, the portion of the first portion 101 close to the third portion 103, the third portion 103, and the second portion 102 forms the non-display area 02. Further, as discussed above, the light-emitting layer, the encapsulation layer, and the touch layer may be in the display area 01 in the first portion 101 to implement the screen display function and the touch function, and the plurality of lines connected to the plurality of thin film transistors in the circuit layer may extend from the display area 01 to the non-display area 02, that is, the plurality of lines of the first portion 101 beyond a portion outside the display area 01 extend to the second portion 102.

It is understood that in the present embodiment, by extending the protective layer 20 to the first portion 101, and the distance S2 between the side of the protective layer 20 close to the display area 01 and the side of the third portion 103 close to the display area 01 is equal to or greater than 0.45 mm, the protective layer 20 may cover the plurality of lines exposed in the portion of the first portion 101 beyond the display area 01, and reduce the risk of damage or short circuit of the plurality of lines exposed in the portion of the first portion 101 beyond the display area 01. Further, the protective layer 20 may be composed of, but is not limited to, adhesive tape and ultraviolet curing glue, so that the protective layer 20 has a certain rigidity and flexibility. In addition, the protective layer 20 in this embodiment may cover a part of the plurality of lines on the curved third portion 103 and on the planar first portion 101 at a same time, so as to avoid an excessive difference between the stress on the third portion 103 and the stress on the first portion 101 in the display panel 100, thereby reducing a risk of fracture of the plurality of lines due to the stress unevenness.

In an embodiment, as shown in FIGS. 1 and 2, a distance between the side of the protective layer 20 close to the first portion 101 and the side of the protective layer 20 close to the first portion 101 is equal to or less than 0.6 mm, that is, a distance between the side of the protective layer 20 close to the display area 01 and the side of the protective layer 20 close to the display area 01 is equal to or less than 0.6 mm. It should be noted that, in this embodiment, the thickness of the side of the protective layer 20 close to the display area 01 is less than the thickness of the middle portion of the protective layer 20, that is, in the process of manufacturing the display panel 100, the final formed protective layer 20 on the side close to the display area 01 does not have the capillary phenomenon as shown in FIG. 3. As described above, as shown in FIG. 5, the removable film layer 30 is formed prior to the protective layer 20, and after removing the removable layer 30, the light-emitting layer, the encapsulation layer, and the touch layer are formed, and further the cover layer is formed on the touch layer. Specifically, in consideration of interference between the cover layer and the protective layer, a gap H may be provided therebetween, that is, after the size of the display panel 100 and the gap H are determined, the size of the cover layer may be determined by the distance S2, and projections of the light-emitting layer and the touch layer for forming the display area 01 on the cover layer should be within a boundary of the cover layer, that is, the size of the cover layer may determine the size of the display area 01. As described above, the distance S2 between the side of the protective layer 20 close to the display area 01 and the side of the third portion 103 close to the display area 01 can determine an area of the display area 01.

It can be understood that, in this embodiment, the distance S2 between the side of the protective layer 20 close to the display area 01 and the side of the third portion 103 close to the display area 01 is equal to or less than 0.6 mm, so that the protective layer 20 can be prevented from occupying too much space on the first portion 101 due to exceeding beyond the third portion 103, and the distance between the light-emitting layer and the touch layer formed and the third portion 103 is prevented from being too large, thereby limiting the size of the display area 01. Therefore, the present embodiment reduces the risk of causing the protective layer 20 to tear and lose the protective effect and even damaging the panel layer 10 when the removable film layer 30 is later removed, thereby improving the yield of the display panel 100 in mass production, and effectively increasing the screen ratio of the display panel 100.

In an embodiment, as shown in FIGS. 1 and 2, the protective layer 20 extends from the third portion 103 to the second portion 102, and a distance between the side of the protective layer 20 away from the first portion 101 and the side of the third portion 103 away from the first portion 101 is equal to or greater than 0.45 mm, that is, a distance between the side of the protective layer 20 away from the display area 01 and the side of the third portion 103 away from the display area 01 is equal to or greater than 0.45 mm. Specifically, as described above, the plurality of lines connected to the plurality of thin film transistors in the circuit layer may extend from the display area 01 to the non-display area 02, that is, a part of the plurality of lines of the first portion 101 exposed beyond the display area extend to the second portion 102, that is, the second portion 102 also includes a part of the lines.

Similarly, in the present embodiment, by extending the protective layer 20 to the second portion 102, and a distance S3 between the side of the protective layer 20 away from the display area 01 and the side of the third portion 103 away from the display area 01 is equal to or greater than 0.45 mm, so that the protective layer 20 may cover the plurality of lines exposed in the second portion 102, thereby reducing a risk of damage or short circuit of the plurality of lines exposed in the second portion 102. Further, similarly, the protective layer 20 made of the adhesive tape and the ultraviolet curing glue may have both a certain rigidity and flexibility, that is, the protective layer 20 in this embodiment may cover a part of the plurality of lines on the curved third portion 103 and on the planar second portion 102 at a same time, so as to avoid an excessive difference between stress on the third portion 103 and stress on the second portion 102 in the display panel 100, thereby reducing a risk of fracture of the plurality of lines due to the stress unevenness.

In an embodiment, as shown in FIGS. 1 and 2, the thickness of each portion of the protective layer 20 is equal to or greater than 30 mm and less than 100 mm. Specifically, as described above, the protective layer 20 may include lines in a protective line layer and extending into the non-display area 02, and the protective layer 20 takes into account rigidity and flexibility of an area of the display panel 100 in the third portion 103 and its vicinity. It is known from the above that thicknesses of different positions in the protective layer 20 may be different. Further, in this embodiment, the thicknesses of each portion of the protective layer 20 is defined to be equal to or greater than 30 μm, and less than 100 μm. For example, the thickness of the side of the protective layer 20 close to the display area 01 is equal to 30 μm, and the thickness of the middle portion of the protective layer 20 can approach 100 μm.

It can be understood that a minimum thickness of each portion of the protective layer 20 in this embodiment is 30 μm, which ensures the protective effect of the protective layer 20 on a part of the plurality of lines in the non-display area 02. Further, a maximum thickness of each portion of the protective layers 20 is 100 μm, so that an excessive rigidity of the protective layer 20 due to an excessive thickness is avoided, and thereby taking into account the rigidity and the flexibility. Meanwhile, in a top view, a corresponding neutral layer which all film layers overlapping on the third portion 103 as a whole is in an appropriate position.

In an embodiment, as shown in FIGS. 1 and 2, the support layer further includes a second support portion 602 disposed opposite to the second portion 102. Wherein the first support portion 601 is used to support the first portion 101, the second support portion 602 is used to support the second portion 102, rigidity of the first support portion 601 and rigidity of the second support portion 602 may be greater than rigidity of the substrate layer, and the constituent material of the first support portion 601 and the constituent material of the second support portion 602 may be same. Further, the first support portion 601 on a side close to the second support portion 602 and the second support portion 602 on a side close to the first support portion 601 may be fixedly disposed. As discussed above, the substrate layer may form the first portion 101, the third portion 103, and the second portion 102, so that a shape of the third portion 103 may be further stabilized.

Figure 6:
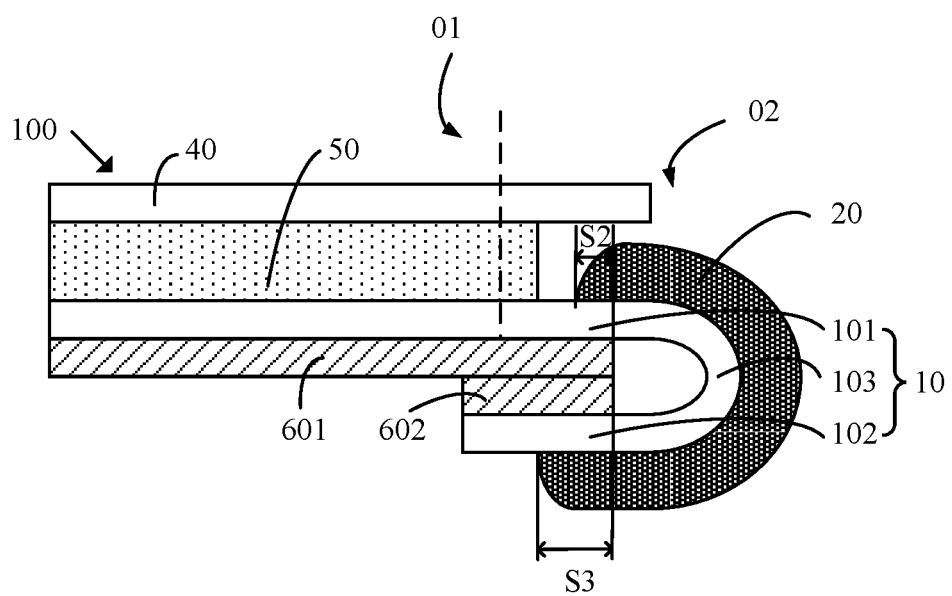
FIG. 6 is a cross-sectional schematic diagram of a fifth display panel according to an embodiment of the present invention.

In an embodiment, as shown in FIG. 6, the display panel 100 further includes an adhesive layer 50 between the cover layer 40 and the first portion 101, and the adhesive layer 50 is used to secure the cover layer 40 to the first portion 101. There is a gap between the adhesive layer 50 and the protective layer 20, and a thickness of the adhesive layer 50 is greater than the thickness of the side of the protective layer 20 close to the first portion 101, that is, the thickness of the adhesive layer 50 is greater than the thickness of the side of the protective layer 20 close to the display area 01. Wherein the adhesive layer 50 may be colorless and transparent, and has a light transmittance greater than or equal to 90%. The adhesive layer 50 may be made of, but is not limited to, an optical transparent adhesive, and the cover layer 40 may be made of, but is not limited to, glass.

It can be understood that, considering that the thickness of the side of the protective layer 20 close to the display area 01 is less than the thickness of the middle portion of the protective layer 20, and the rigidity of the adhesive layer 50 is low, there is a gap between the adhesive layer 50 and the protective layer 20 in this embodiment to avoid an interference problem caused by a low flatness of the adhesive layer 50 due to a contact between the adhesive layer 50 and the protective layer 20. Further, the thickness of the adhesive layer 50 in this embodiment is greater than the thickness of the side of the protective layer 20 close to the display area 01, so that the cover layer 40 can be further elevated to avoid interference caused by the cover layer 40 overlapping the protective layer 20 in a vertical direction. Even further, because the thickness of the adhesive layer 50 is greater than the thickness of the side of the protective layer 20 close to the display area 01, the cover layer 40 may extend horizontally to overlap the protective layer 20 to shield the protective layer 20, and further, the cover layer 40 may extend to surround and cover the middle portion of the protective layer 20.

The present invention provides a mobile terminal including a terminal body and a display panel according to any one as described above, wherein the terminal body and the display panel are integrated.

The present invention provides a display panel and a mobile terminal, the display panel and the mobile terminal include a panel layer including a first portion, a second portion, and a third portion connected to the first portion and the second portion, wherein the third portion is curved; a protective layer on the third portion; a support layer on a side of the panel layer away from the protective layer, wherein the support layer includes a first support portion disposed opposite to the first portion; a cover layer on the first portion, wherein the cover layer includes an ink layer formed as an edge of the cover layer; wherein a thickness of a side of the protective layer close to the first portion is less than a thickness of a middle portion the protective layer, and the side of the protective layer close to the first portion is between a side of the first portion close to the third portion and an inner boundary of the ink layer. According to a principle of capillary action, the thickness of the side of the protective layer close to the first portion in the present invention is less than the thickness of the middle portion of the protective layer, so that in the process of manufacturing the protective layer, a preset distance reserved between the constituent material of the protective layer and the removable film layer is ensured to achieve a side of a finally formed protective layer close to the first portion not be in contact excessively or even not contacting the removable film layer at all, thereby reducing a risk of tearing the protective layer when removing the removable film, and increasing the yield of the display panel in mass production.

The display panel and the mobile terminal provided in the embodiment of the present invention are described in detail above. The principle and the embodiment of the present invention are described in detail herein. The description of the above embodiment is merely intended to help understand the technical solution and the core idea of the present invention. Those of ordinary skill in the art will appreciate that they may still modify the technical solutions described in the foregoing embodiments, or equivalently replace some of the technical features therein. These modifications or substitutions do not separate the nature of the respective solutions from the scope of the solutions of the embodiments of the present invention.

What is claimed is:

1. A display panel, comprising: a panel layer comprising a first portion, a second portion, and a third portion connected to the first portion and the second portion, wherein the third portion is curved; a protective layer on the third portion; a support layer on a side of the panel layer away from the protective layer, wherein the support layer comprises a first support portion disposed opposite to the first portion; a cover layer on the first portion, wherein the cover layer comprises an ink layer formed as an edge of the cover layer; wherein a thickness of a side of the protective layer close to the first portion is less than a thickness of a middle portion of the protective layer, and the side of the protective layer close to the first portion is between a side of the first portion close to the third portion and an inner boundary of the ink layer; wherein the thickness of the side of the protective layer close to the first portion is less than or equal to 60 μm; wherein a thickness of an edge of the protective layer is less than the thickness of the middle portion of the protective layer; and the display panel further comprises: an adhesive layer between the cover layer and the first portion, wherein the adhesive layer is configured to secure the cover layer to the first portion, a gap is defined between the adhesive layer and the protective layer, and a thickness of the adhesive layer is greater than the thickness of the side of the protective layer close to the first portion; and the support layer further comprises a second support portion disposed opposite to the second portion; and the first support portion on a side close to the second support portion and the second support portion on a side close to the first support portion may are fixedly disposed; and a top view of the cover layer overlap the gap and the side of the protective layer close to the first portion.

2. The display panel according to claim 1, wherein the protective layer extends from the third portion to the first portion, and a distance between the side of the protective layer close to the first portion and a side of the third portion close to the first portion is equal to or greater than 0.45 mm.

3. The display panel according to claim 2, wherein the distance between the side of the protective layer close to the first portion and the side of the third portion close to the first portion is equal to or less than 0.6 mm.

4. The display panel according to claim 1, wherein the protective layer extends from the third portion to the second portion, and a distance between a side of the protective layer away from the first portion and a side of the third portion away from the first portion is equal to or greater than 0.45 mm.

5. The display panel according to claim 1, wherein a thickness of each portion of the protective layers is equal to or greater than 30 μm, and is equal to or less than 100 μm.

6. A display panel, comprising: a panel layer comprising a first portion, a second portion, and a third portion connected to the first portion and the second portion, wherein the third portion is curved; a protective layer on the third portion; a support layer on a side of the panel layer away from the protective layer, wherein the support layer comprises a first support portion disposed opposite to the first portion; a cover layer on the first portion, wherein the cover layer comprises an ink layer formed as an edge of the cover layer; wherein a thickness of a side of the protective layer close to the first portion is less than a thickness of a middle portion of the protective layer, and the side of the protective layer close to the first portion is between a side of the first portion close to the third portion and an inner boundary of the ink layer; wherein the thickness of the side of the protective layer close to the first portion is less than or equal to 60 μm; wherein a thickness of an edge of the protective layer is less than the thickness of the middle portion of the protective layer; and the display panel further comprises: an adhesive layer between the cover layer and the first portion, wherein the adhesive layer is configured to secure the cover layer to the first portion, a gap is defined between the adhesive layer and the protective layer, and a thickness of the adhesive layer is greater than the thickness of the side of the protective layer close to the first portion; and the support layer further comprises a second support portion disposed opposite to the second portion; and the first support portion on a side close to the second support portion and the second support portion on a side close to the first support portion may are fixedly disposed; and a top view of the cover layer overlap the gap and the side of the protective layer close to the first portion.

7. The display panel according to claim 6, wherein the thickness of the side of the protective layer close to the first portion is less than or equal to 60 μm.

8. The display panel according to claim 6, wherein a thickness of an edge of the protective layer is less than the thickness of the middle portion of the protective layer.

9. The display panel according to claim 6, wherein the protective layer extends from the third portion to the first portion, and a distance between the side of the protective layer close to the first portion and a side of the third portion close to the first portion is equal to or greater than 0.45 mm.

10. The display panel according to claim 9, wherein the distance between the side of the protective layer close to the first portion and the side of the third portion close to the first portion is equal to or less than 0.6 mm.

11. The display panel according to claim 6, wherein the protective layer extends from the third portion to the second portion, and a distance between a side of the protective layer away from the first portion and a side of the third portion away from the first portion is equal to or greater than 0.45 mm.

12. The display panel according to claim 6, wherein a thickness of each portion of the protective layers is equal to or greater than 30 μm, and is equal to or less than 100 μm.

13. A mobile terminal, wherein the mobile terminal comprises a terminal body and a display panel, the terminal body and the display panel are integrated, and the display panel comprises: a panel layer comprising a first portion, a second portion, and a third portion connected to the first portion and the second portion, wherein the third portion is curved; a protective layer on the third portion; a support layer on a side of the panel layer away from the protective layer, wherein the support layer comprises a first support portion disposed opposite to the first portion; a cover layer on the first portion, wherein the cover layer comprises an ink layer formed as an edge of the cover layer; wherein a thickness of a side of the protective layer close to the first portion is less than a thickness of a middle portion of the protective layer, and the side of the protective layer close to the first portion is between a side of the first portion close to the third portion and an inner boundary of the ink layer; wherein the thickness of the side of the protective layer close to the first portion is less than or equal to 60 μm; wherein a thickness of an edge of the protective layer is less than the thickness of the middle portion of the protective layer; and the display panel further comprises: an adhesive layer between the cover layer and the first portion, wherein the adhesive layer is configured to secure the cover layer to the first portion, a gap is defined between the adhesive layer and the protective layer, and a thickness of the adhesive layer is greater than the thickness of the side of the protective layer close to the first portion; and the support layer further comprises a second support portion disposed opposite to the second portion; and the first support portion on a side close to the second support portion and the second support portion on a side close to the first support portion may are fixedly disposed; and a top view of the cover layer overlap the gap and the side of the protective layer close to the first portion.

14. The mobile terminal according to claim 13, wherein the protective layer extends from the third portion to the first portion, and a distance between the side of the protective layer close to the first portion and a side of the third portion close to the first portion is equal to or greater than 0.45 mm.

* * * * *